Jan. 2, 1962 W. SHOCKLEY 3,015,762

SEMICONDUCTOR DEVICES

Filed March 23, 1959

INVENTOR.

William Shockley.

United States Patent Office 3,015,762

Patented Jan. 2, 1962

3,015,762
SEMICONDUCTOR DEVICES

William Shockley, 23466 Corta Via, Los Altos, Calif.
Filed Mar. 23, 1959, Ser. No. 801,158
12 Claims. (Cl. 317—234)

This invention relates to semiconductor structures containing a large number of p-n junctions. More particularly, it is concerned with bodies of semiconductor having contiguous, successively alternating zones of p-type and n-type conductivity. This invention makes advantageous use of such structures to accomplish certain purposes more economically and in some cases more efficiently and compactly than by making a sequence of separate devices having individual junctions.

A general object of this invention is to provide a single body of semiconductor material with a multiplicity of alternating zones of alternating conductivity type to obtain higher voltage performance than would otherwise be possible.

An important specific object of this invention is to produce an improved solar battery containing a multiplicity of solar cells in series.

A further objective of the invention is to produce a solar battery having higher efficiency than conventional solar batteries in converting sunlight into electrical energy.

Another object of the invention is to produce a solar battery producing higher voltage for a battery of a given area than can be accomplished with conventional solar batteries.

A still further objective of the invention is to produce a solar battery having less weight per unit power produced than a conventional solar battery.

Briefly, the invention provides a body of semiconductor material comprising a sequence of zones of alternating conductivity type, the zones being separated by junctions of alternating first and second polarities. A low impedance path is provided for current flow from one zone to an adjacent zone across the junctions of the first polarity so the body can be used as a high voltage rectifier or as a highly efficient, high voltage solar battery.

In one form of the invention, the low impedance path from one zone across the junctions of the first polarity is provided by the presence of a high density of recombination centers in the vicinity of the junctions of the first polarity. In another form, the low impedance means is a metallic ohmic connection from zone to zone across the junctions of the first polarity.

When the semiconductor body is used as a solar battery, the body preferably is relatively thin in a direction transverse to the direction extending from zone to zone, and the body has relatively large first and second faces extending transverse to the direction of the thin dimension. Junctions of the second polarity are disposed with substantial areas extending in the same general direction as one of the faces so as to lie under respective relatively thin layers of extended regions of the first conductivity type disposed on zones of the second conductivity type. In the preferred form of the body, the thin layers of extended regions of material of the first conductivity type cover at least 80% of each of the areas of the first and second faces, so that junctions of the second polarity are disposed with substantial areas extending in the direction of the two faces and just under the surface of each of the two faces.

The invention will be more fully understood from the following detailed description taken in conjunction with the accompanying drawings in which.

Figure 1:
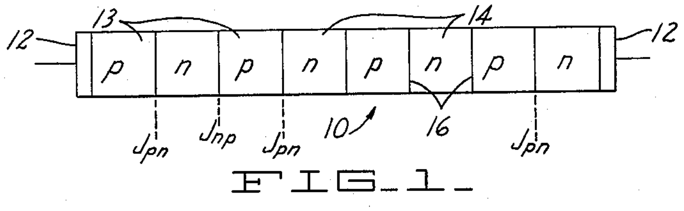
FIG. 1 is a schematic elevation of a body of semiconductor material containing alternating zones of opposite conductivity types separated by a sequence of junctions of alternating polarity.

Referring to FIG. 1, an elongated body 10 of semiconductor material such as germanium or silicon, has metal terminals 12 at each end. The body is of any desired cross sectional area, such as rectangular, circular, etc., and it includes a sequence of p-type semiconductor material zones 13 with a sequence of separate n-type semiconductor material zones 14 disposed between adjacent p-type zones so that a series of longitudinally spaced junctions 16 are formed with the barrier fields of adjacent junctions being of opposite polarities. As shown in FIG. 1, the left terminal is connected to a zone of p-type semiconductor material, and the right terminal is connected to a zone of n-type semiconductor material, and the sequence of polarity of the junctions is $J_{pn}$, $J_{np}$, . . . $J_{pn}$, reading from left to right.

Multi-zone crystals of semiconductor of the type shown in FIG. 1 can be prepared in a variety of ways, such as by well-known techniques involving rate growing. For example, R. N. Hall reports in the Physical Review (vol. 88, p. 139, October 1, 1952) that "more than a hundred uniformly spaced p-n junctions have been produced in an ingot of germanium by periodically varying the rate of growth of the crystal from a properly doped melt." My co-pending application Serial No. 623,586, filed November 21, 1956, now Patent No. 2,879,189, discloses means for growing more complex junction structures directly from a melt. By using relatively thin slices of semiconductor material and oxide masking techniques, such as are disclosed in my co-pending application Serial No. 782,782, filed December 24, 1958, now abandoned, successive zones can also be formed by diffusing proper impurities entirely through the thin slices at properly spaced locations.

The structure of FIG. 1 can be used as a very high voltage rectifier, provided the rectification properties of adjacent junctions are sufficiently different. In using the structure as a rectifier, the polarities of the two terminals are periodically reversed. For one polarity of voltage, the set of junctions of one polarity, say the $J_{np}$ junction, are biased forward, and for the other voltage they are biased in reverse. If the $J_{np}$ junctions have a reverse saturation current which is many times larger than the maximum forward current passed by the $J_{pn}$ junctions during forward operation of the $J_{pn}$ junction, then the voltage drop across the $J_{np}$ junctions is relatively small under all circumstances, and they are effectively short circuits, so that the body shown in FIG. 1 is essentially equivalent to a plurality of separate rectifiers connected in series. It has the advantage, however, that the entire structure can be made in one unit, and space, weight, and cost associated with connecting a series of separate rectifiers is eliminated.

Figure 2:
FIG. 2 is a graph of the corresponding distribution of recombination centers along the length of the body which impart different characteristics to the alternating junctions of FIG. 1.

One way of making the junctions of one polarity, say the $J_{np}$ junctions, effective short circuits is to provide a high concentration of recombination centers in the vicinity of the junctions. Thus there is a high concentration of recombination centers at each $J_{np}$ junction so those junctions offer low impedance to current flow in either direction across them. FIG. 2 shows the concentration of recombination centers or deathnium ($C_{rc}$) in the body plotted against the distance ($D_B$) from the left end of the body. This distribution of recombination centers shown in FIG. 2 may be produced by diffusing recombination centers such as gold into silicon in a geometrically controlled pattern by using well known masking and electroplating techniques so that the concentration of the gold is much higher at every $J_{np}$ junction, causing these junctions to draw a high reverse current.

An alternative way of producing geometrically controlled recombination centers is to bombard the material in the vicinity of the junctions to be shorted with nuclear particles or high energy electrons. The radiation damage produced by these is well known to act as recombination centers.

Still another means of producing high reverse currents for some of the junctions is to introduce mechanical damage, which produces dislocations that are sources of recombination of holes and electrons. Thus, the application of pressure to the body in the vicinity of the $J_{np}$ junctions of FIG. 1 causes deterioration of the rectification properties of these junctions.

Figure 3:
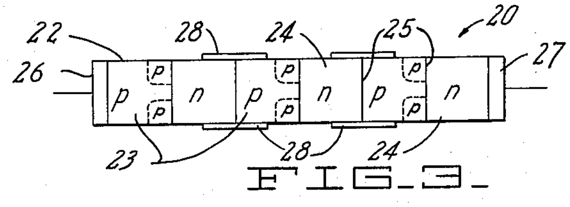
FIG. 3 is a schematic elevation of a semiconductor body in which metallic plating is used as means for imparting different properties to alternating junctions in a multi-zone structure like that of FIG. 1.

FIG. 3 represents a preferred form of a multi-junction structure 20 for use in high voltage rectifiers. The structure includes an elongated body 22 of semiconductor material which includes alternate p-type zones 23 and n-type zones 24 with junctions 25 formed between adjacent zones. The left and right ends of the body have metal terminals 26, 27, respectively. Alternate junctions, namely the $J_{np}$ junctions (reading from left to right), are electrically short circuited by segments of metallic plating 28 on the surface of the body over the junctions, thereby making ohmic contacts to the adjacent zones. Geometrical control of the plating may be achieved by many means, such as plating through photo-resist masks or plating uniformly over the surface and removing the material from preferred areas using photo-resist techniques.

FIG. 3 also illustrates a preferred form of the $J_{pn}$ junctions, which have more weakly doped p-type material near their surfaces in the areas p- enclosed by dotted lines. These weakly doped areas produce a guard-ring effect on these junctions. Other means of producing guard-ring junctions are discussed in my co-pending application Serial No. 782,782 referred to above. As a result of the weakly doped areas in the structure of FIG. 3, reverse current in the $J_{pn}$ junctions, is largely concentrated in the center region, and the electric field at the surface is made relatively small. As a consequence of this, when the structure is used as a rectifier, surface damage due to breakdown in the reverse direction across the surface of one of the junctions is prevented. It is not necessary for such a structure to provide equal reverse resistances for each of the many $J_{pn}$ junctions, and no junction can receive a voltage in the reverse direction sufficient to receive damage. The reason for this is that before damaging voltage is reached for a particular junction, the junction carries current by the avalanche process through its interior at a voltage well below that at which surface damage can occur, and further increases in voltage then occur across other junctions. By this means very high voltage rectifiers are produced.

The effect of surface leakage, when using the structures of FIGS. 1–3 as rectifiers, can be materially reduced by producing more heavily doped p- and n-type regions on the surface near the $J_{pn}$ junctions in accordance with the principles disclosed in my co-pending application 780,327, December 15, 1958.

Figure 4:
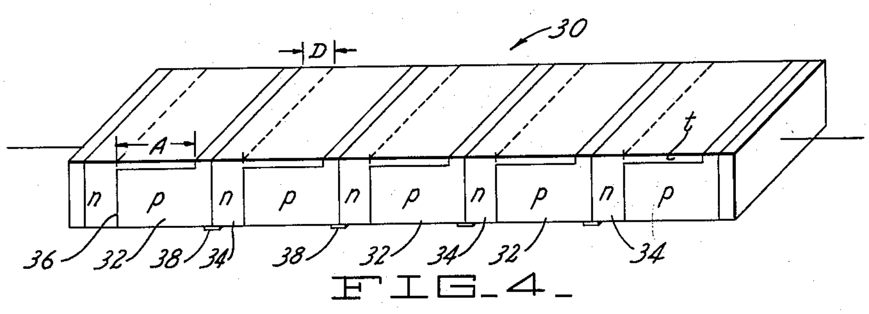
FIG. 4 is a schematic perspective view of a multi-zone multi-junction semiconductor structure particularly suitable for use as a high efficiency, high voltage solar battery.

One advantageous way of using the multi-junction structures of this invention is to make more efficient and more compact solar batteries, as shown in FIG. 4. The battery of FIG. 4 includes a rectangular slice or body 30 of semiconductor material, such as silicon, several times longer than it is wide, and very thin in proportion to its length or width. The body includes a sequence of p-type zones 32 separated by n-type zones 34 to provide a sequence of junctions 36 of alternate polarities $J_{np}$, $J_{pn}$, . . . $J_{np}$, reading from right to left in FIG. 4. The zones are generally L-shaped and interlocked as shown in FIG. 4 to form $J_{pn}$ junctions which are normal to the longitudinal axis of the body, and to form $J_{np}$ junctions so a portion of each $J_{np}$ junction area is normal to the longitudinal axis of the body and a portion is parallel to the axis, the latter portion of each $J_{np}$ junction lying under a respective thin layer of n-type material having a thickness $t$ over a major surface of the body. The length of the thin layer of n-type material is designated A in FIG. 4, and the portion of the $J_{np}$ junction area underlying it is the active region of the battery. The $J_{pn}$ junctions are shorted by segments 38 of metallic coating on the surface of the body.

One way for making the battery of FIG. 4 from a thin slice of silicon treated to be of p-type conductivity is to diffuse the n-type inserts or zones from the two major faces of the body so that they meet in the middle, separating the body into zones of alternating conductivity types. Methods for accomplishing this are disclosed in my co-pending application 782,782, previously referred to. Subsequent to this diffusion, oxide masking techniques are used to diffuse a thin layer of n-type material over the major portion of the indicated area of each of the p-type zones, forming the active regions of the battery. The regions over the n-type inserts are relatively inactive or photoelectrically dead, and the length of these regions is designated D.

The various diffusion, photo-resist, electroplating, etc. techniques referred to herein are disclosed in the Bell Laboratories Series on Transistor Technology, published in three volumes by D. Van Nostrand Co., Inc., of Princeton, N.J.

Optimum efficiency in solar batteries is obtained by keeping the active regions A only a few millimeters in length. This point is discussed in the article by M. B. Prince in the Bell Telephone Laboratories Series "Transistor Technology," vol. Two, p. 497 (published by D. Van Nostrand).

Solar batteries prior to this invention represent an unnecessarily unfavorable compromise of properties compared to the structure of FIG. 4. Referring to FIG. 8 and the text of the Prince article, it is noted that in order to obtain the maximum amount of power from a solar battery it is necessasy to make the width of the active region (corresponding to the dimension A of FIG. 4) about 1.5 cm. Solar cells of the type disclosed by the Prince article have contacts of the same polarity at both ends of the action region, so that the maximum power will be obtained from a cell like that in FIG. 4 when the length of dimension A is about .8 cm.

The Prince article on p. 507, referring to FIG. 8 of the article, points out that the maximum efficiency (high photosensitivity) of a silicon solar cell is obtained by having the width of the cell (the dimension corresponding to A in FIG. 4) as small as possible. The $P_A\nu W$ curve of Prince's FIG. 8 shows that maximum efficiency is almost achieved when the dimension is about .3 cm.

With the battery of FIG. 4, dimension A can be made 3 mm. for maximum efficiency, and dimension D (dead area) 0.1 mm. so there is not much loss due to the presence of photoelectrically inactive area.

In a preferred form of FIG. 4 the slice of silicon is about 100 microns thick or 0.1 mm. Under these conditions, the n-type regions which are inserted through the slice will also be about 0.1 mm. (i.e. $D$=.1 mm.). Thus, only a small loss in efficiency results from having the dimension A as small as 3 mm., since the length of the inactive region is only about 3% of the active region.

Thus it is evident that individual solar cells can be made in a structure of the form of FIG. 4 with higher efficiency of conversion of the sunlight per unit area than is true for conventional solar cells.

Figure 5:
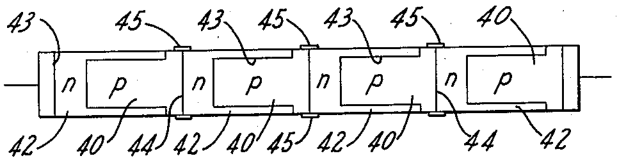
FIG. 5 is a schematic elevation af a structure like that of FIG. 4 which is active on both sides.

FIG. 5 shows an alternate embodiment of the battery which is similar to that of FIG. 4, except the battery of FIG. 5 is photoelectrically active on both major surfaces because n-type material is diffused into both major surfaces of the p-type zones 40 to form U-shaped n-type zones 42, and U-shaped $J_{np}$ junction 43. The $J_{pn}$ junctions 44 are shorted by segments 45 of metal coating.

It is evident that a further advantage of cells and batteries of the form shown in FIG. 4 and FIG. 5 is that the currents and voltages they produce are more suitable for operating transistors than conventional solar cells. As is indicated in the article by Prince, a silicon solar cell of 1 sq. cm. of area produces a current of the order of 20 ma. This current is often sufficient to operate a transistor circuit. For a structure like that shown in FIG. 4 a cell only 3 mm. long in the direction of dimension A, and only 3 cm. wide in the direction perpendicular to dimension A will thus produce a current of the order of 20 ma. and a voltage of the order of 1.5 volts per centimeter, which is about five times the voltage per cm. obtained with conventional cells connected together in a battery.

The highly efficient and compact solar battery of this invention is ideally suited for use in miniaturized circuits where reduction of size or weight is important, such as in satellites.

I claim:

1. A body of semiconductor material comprising a sequence of zones of alternating conductivity types separated by junctions of alternating first and second polarities, and a high density of recombination centers in the vicinity of junctions of the first polarity for providing a low impedance path for current flow from one zone to an adjacent zone across the junctions of the fist polarity.

2. A body of semiconductor material comprising a sequence of zones of alternating first and second conductivity types separated by junctions of alternating first and second polarities, and means for providing a low impedance path for current flow from one zone to an adjacent zone across a junction of the first polarity, the body being relatively thin in a dimension extending substantially parallel to junctions of the first polarity and having relatively large first and second major faces disposed transverse to the direction of the thin dimension, the junctions of the second polarity lying near the surface of the first face and below a thin region of extended area of material of the first conductivity type.

3. Apparatus according to claim 2 in which the said thin region of material of the first conductivity type cover at least 80% of the said first face of the body.

4. Apparatus according to claim 2 in which said means for providing a low impedance path for current flow from one zone to an adjacent zone across a junction of the first polarity comprises a metallic ohmic connection from zone to zone across junctions of the first polarity.

5. Apparatus according to claim 2 wherein said means providing a low impedance path for current flow from one zone to an adjacent zone across the junction of the first polarity comprises high density recombination centers in the vicinity of the first junction.

6. Apparatus according to claim 2 in which the junctions of the second polarity lie near the surface of each of the two said major faces and below respective thin regions of extended areas of material of the first conductivity type on each face.

7. Apparatus according to claim 6 in which the said thin regions of material of the first conductivity type cover at least 80% of the areas of both of the major faces of the body.

8. A body of semiconductor material comprising a sequence of zones of alternating conductivity types separated by junctions of alternating first and second polarities, means for providing a low impedance path for current flow from one zone to an adjacent zone across a junction of the first polarity, and means for concentrating reverse current flow across junctions of the second polarity in the interior portion of the body.

9. A body of semiconductor material comprising a sequence of zones of alternating first and second conductivity types separated by junctions of alternating first and second polarities, the body being relatively thin in the dimension extending substantially parallel to the junctions of the first polarity and having relatively large first and second major faces disposed transverse to the direction of the thin dimension, the junctions of the second polarity lying near the surface of the first face and below a thin region of extended area of material of the first conductivity type.

10. A body of semiconductive material according to claim 9 in which said thin region of material of the first conductivity type covers at least 80% of the said first face of the body.

11. A body of semiconductive material according to claim 9 in which the junctions of the second polarity lie near the surface of each of the two said major faces and below respective thin regions of extended areas of material of the first conductivity type on each face.

12. Apparatus as in claim 11 in which said thin regions of material of the first conductivity type cover at least 80% of the area of both of the faces of the body.

References Cited in the file of this patent

UNITED STATES PATENTS

| | | |
|---|---|---|
| 2,875,505 | Pfann | Mar. 3, 1959 |
| 2,884,607 | Uhlir | Apr. 28, 1959 |